United States Patent [19]

Hofmanis et al.

[11] 4,342,029
[45] Jul. 27, 1982

[54] COLOR GRAPHICS DISPLAY TERMINAL

[75] Inventors: Ilmars A. Hofmanis, Commack; Joseph A. Lebel, New Hyde Park, both of N.Y.

[73] Assignee: Grumman Aerospace Corporation, Bethpage, N.Y.

[21] Appl. No.: 8,425

[22] Filed: Jan. 31, 1979

[51] Int. Cl.³ .............................................. G09G 1/28
[52] U.S. Cl. .................................. 340/703; 340/721; 340/799; 340/709; 340/747
[58] Field of Search ............... 340/703, 709, 711, 701, 340/721, 798, 799, 747

[56] References Cited

U.S. PATENT DOCUMENTS

| | | | |
|---|---|---|---|
| 3,287,492 | 11/1966 | Milroy | 358/81 |
| 3,364,853 | 10/1967 | Koster et al. | 101/114 |
| 3,387,084 | 6/1968 | Hine et al. | 358/81 |
| 3,389,404 | 6/1968 | Koster | 364/900 |
| 3,603,962 | 9/1971 | Lechner | 340/703 |
| 3,624,634 | 11/1971 | Clark | 340/703 |
| 3,710,011 | 1/1973 | Altemus et al. | 358/82 |
| 3,742,125 | 6/1973 | Siegel | 358/81 |
| 3,849,793 | 11/1974 | Ablett | 358/81 |
| 3,886,588 | 5/1975 | Dalke | 358/82 |
| 3,909,818 | 9/1975 | Dalke et al. | 340/703 |
| 3,925,776 | 12/1975 | Swallow | 340/703 |
| 3,944,993 | 3/1976 | Dalke et al. | 340/703 |
| 3,997,891 | 12/1976 | Iwamura et al. | 340/703 |
| 4,103,331 | 7/1978 | Thacker | 340/799 |
| 4,115,765 | 9/1978 | Hartke | 340/799 |
| 4,117,473 | 9/1978 | Habeger, Jr. et al. | 340/703 |
| 4,190,835 | 2/1980 | Boynak | 340/799 |
| 4,191,956 | 3/1980 | Groothois | 340/799 |
| 4,203,107 | 5/1980 | Lovercheck | 340/711 |

Primary Examiner—Marshall M. Curtis
Attorney, Agent, or Firm—Morgan, Finnegan, Pine, Foley & Lee

[57] ABSTRACT

A color graphics display terminal having an edit mode of operation and a graphic mode of operation is disclosed. The edit mode provides interactive man-machine interface capability with an external digital computer, such as an automatic test system control computer. When operating in the graphic mode it decodes received instructions to produce a multi-colored visual display on a raster scan cathode ray tube color monitor. Independent point addressable memories are provided for storing the information to be displayed in the two operating modes. Consequently, the information transmitted to the terminal for display in the graphic mode is saved when the terminal is switched into the edit mode and vice versa. A key feature is that programs can be edited without destroying the last graphic image produced by the program being edited. Data and control commands (such as mode change) are entered into the terminal via a keyboard. The terminal is interfaced with the control computer via the industry standard interface (IEEE-488).

23 Claims, 5 Drawing Figures

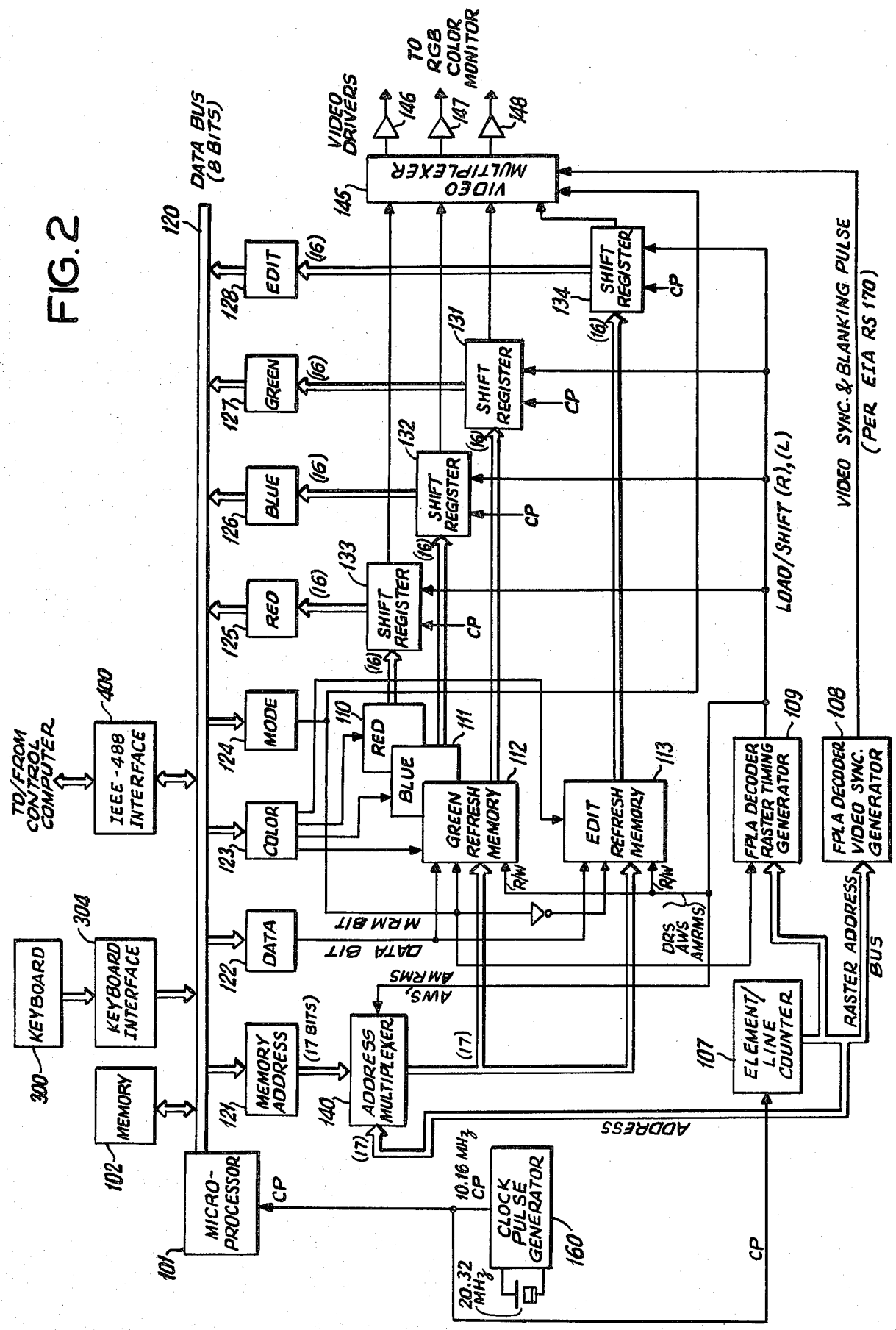

RASTER TO REFRESH MEMORY TIMING (VISIBLE RASTER)

| REFRESH MEMORY SIGNALS | DESCRIPTION |
| --- | --- |
| DRS (R) | READ SIGNAL FOR RIGHT MEMORY ARRAY - TO UPDATE DISPLAY |
| DRS (L) | READ SIGNAL FOR LEFT MEMORY ARRAY - TO UPDATE DISPLAY |
| LOAD/SHIFT (R) | LOADS DATA FROM REFRESH MEMORY TO RIGHT SHIFT REGISTERS |
| LOAD/SHIFT (L) | LOADS DATA FROM REFRESH MEMORY TO LEFT SHIFT REGISTERS |
| AMRMS | READ SIGNAL FOR READING 16 CONTIGUOUS LOCATIONS FROM REFRESH MEMORY DURING READBACK |
| AWS | WRITE SIGNAL TO ENABLE A REFRESH MEMORY WRITE CYCLE |
| R/W | WRITE PULSE REQUIRED DURING AWS PULSE |

RASTER TIMING CONTROL SIGNALS

FIG. 3C

COLOR GRAPHICS DISPLAY TERMINAL

BACKGROUND OF THE INVENTION

This invention relates to the field of graphics display terminals, and more particularly to a dual-mode color graphics display terminal which provides the capability of displaying, in color, and in real-time, computer generated operator instructions, test data and unit-under-test maintenance data in both alphanumeric and graphic formats.

Graphics display terminals are known in the art. Illustrative examples of conventional graphics display terminals are found in U.S. Pat. Nos. 3,389,404 and 3,603,962. However, neither of these systems, either individually or in combination, possess all of the unique features of the terminal of the present invention.

The system described in U.S. Pat. No. 3,389,404 relates to a control and display console for facilitating communication between a human operator and a digital data processing system. One of the drawbacks of the disclosed system is that it utilizes an output device comprising a monochrome cathode ray tube. Since a well constructed multi-color graphics display is generally more meaningful than English language text displayed on a monochrome alphanumeric terminal, this drawback may be significant in many applications.

The system described in U.S. Pat. No. 3,603,962 discloses a computer controlled static color display system capable of displaying graphic and alphanumeric images. One of the drawbacks associated with the disclosed system is that it uses a storage tube as the output device. Images displayed using storage tube technology cannot be updated in real-time. Since a color graphics display terminal which provides the capability of displaying in real-time is quite desirable, this drawback may be significant in many applications.

The major limitation of the prior art graphics terminals, including the two terminals referred to above, is that they are not capable of dual-mode operation, i.e. they do not have the capability to operate in both an edit mode and a graphic mode.

Typically, sophisticated automatic test equipment configured as an automatic test station finds wide application in the avionics instrumentation field. Examples of automatic test equipment are found in the computerized automatic testers (CAT-series ATE) sold by the assignee herein, Grumman Aerospace Corporation. Automatic testing of the various electronic systems and subsystems of an aircraft may be readily conducted by means of such automatic test equipment.

In utilizing automatic test equipment it is possible to detect and isolate faults to an individual subsystem module or to a particular unit-under-test (UUT). In many instances it is possible to further isolate faults to individual printed circuit cards within a particular UUT.

The use of color in displaying a fault diagnostic message particularly enhances the versatility of automatic test equipment. In particular, the capability of color coding the displayed information enhances the test station operator's decision making capability in that it has the effect of "uncluttering" the displayed image. For example, the color red may be utilized to display a diagnostic message indicating that a fault condition is present. In this situation the operator is immediately alerted to the presence of a fault condition by the color of the displayed message.

Similarly, the ability to enter, update (modify) UUT test programs without effecting the graphic image produced previously, and to cause their execution enhances the versatility of automatic test equipment.

It is believed that prior to the present invention, there has not been available a dual-mode color graphics display terminal adapted for data communication with an automatic test station control computer providing the capability of displaying in real-time, and in color, computer generated operator instructions, test results and unit-under-test maintenance data in both alphanumeric and graphic formats. Thus, the need for such a system has gone unfulfilled.

It is accordingly a general object of the present invention to overcome the aforementioned limitations and drawbacks associated with conventional graphics display terminals and to fulfill the needs mentioned by providing a color graphics display terminal having all of the desirable attributes noted above.

It is a particular object of the invention to provide a color graphics display terminal having an edit mode of operation and a graphic mode of operation and adapted for real-time data communication with a control computer.

It is a further object of the invention to provide a color graphics display terminal having an edit mode of operation and a graphic mode of operation and adapted for real-time data communication with an automatic test station control computer and having the capability of displaying in real-time computer generated graphic images and/or alphanumerics in various colors.

Other objects will be apparent in the following detailed description and the practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as a color graphics display terminal having an edit mode of operation and a graphic mode of operation and adapted for real-time data communication with a control computer comprising: means for entering control commands and data into said terminal; means for transmitting the control commands and data from said terminal to said control computer for formulating operating instructions, said operating instructions including terminal operating instructions; means for receiving the terminal operating instructions from said control computer; means for decoding the terminal operating instructions, said decoding means including means for producing a plurality of color video signals; and means for transforming the plurality of color video signals into a multi-colored visual display.

BRIEF DESCRIPTION OF THE DRAWINGS

Serving to illustrate an exemplary embodiment of the invention are the drawings of which:

FIG. 2 is a block diagram of the graphic display generator, in accordance with the present invention;

FIG. 3C is a tabulation of the output signals of the FPLA decoder raster timing generator.

DETAILED DESCRIPTION OF PREFERRED EMBODIMENT

Figure 1:
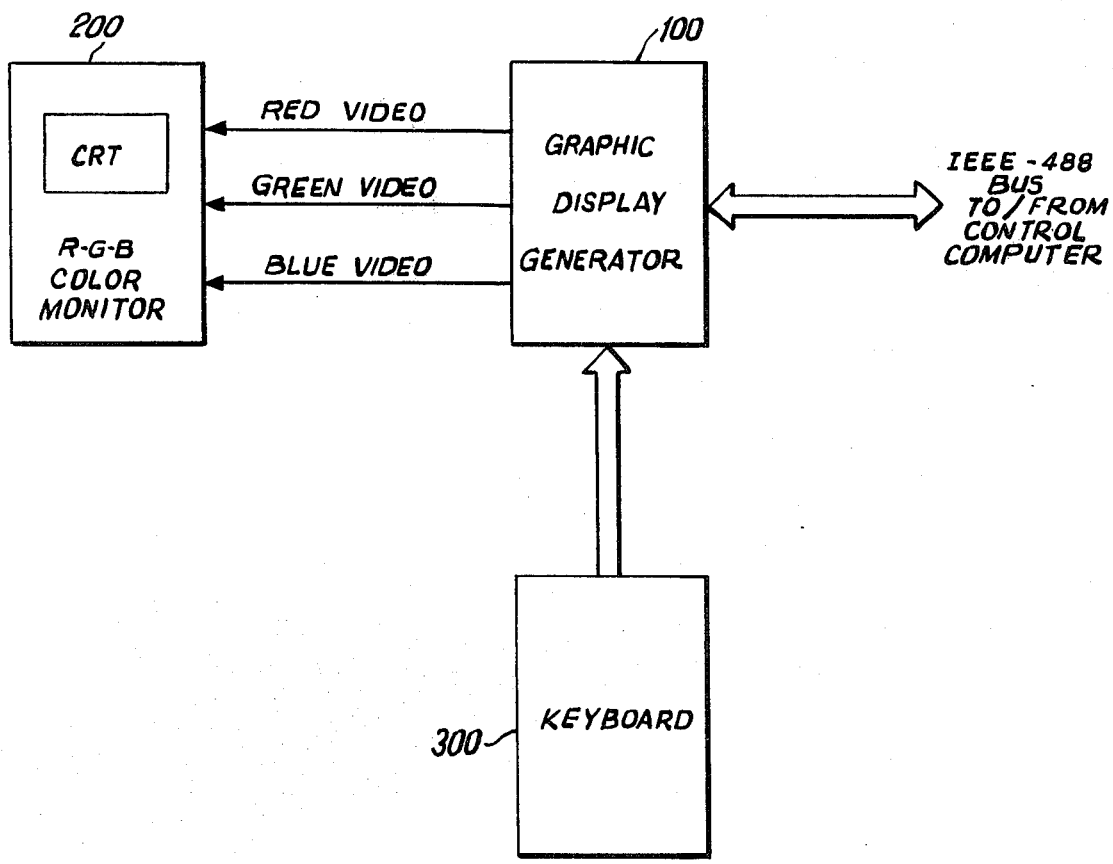
FIG. 1 is a block diagram of the color graphics display terminal, in accordance with the present invention.

Referring to FIG. 1, a block diagram of the color graphics display terminal, in accordance with the present invention, is illustrated. As shown therein, the color graphics display terminal consists of a number of functional subsystems comprising a graphic display generator 100, a red-green-blue cathode ray tube (CRT) color monitor 200 and a keyboard 300. A control computer which is part of an automatic test station (not shown) is interfaced with the color graphics display terminal by means of a conventional interface/output (I/O) channel. The IEEE-488 general purpose interface bus is used for interfacing the color graphics display terminal with the control computer.

Whereas standard computer terminals use a communications protocol defined by EIA standard RS232C to send and receive data from a control computer, the color graphics display terminal of the present invention shares a data communications bus that typically exists in all modern automatic test equipment. This bus is defined in the IEEE-488 standard; and although it was designed to hook up programmable instrumentation to a control computer, it is also used to handle the traffic for the terminal of the present invention. The resulting savings are the elimination of the RS232C hardware and associated bus.

In utilizing the color graphics display terminal depicted in FIG. 1, test station control commands and data are entered via a keyboard 300 which may consist, for example, of the Microswitch K54488-82 SW12. The keyboard 300 serves as the principal input device to the color graphics display terminal. It is compatible with ANSI standards. The keyboard entered characters, consisting of the control commands and data, are transmitted to the control computer utilizing conventional techniques.

In accordance with the requirements of the particular test being conducted, the control computer formulates a series of terminal operating instructions which are received by the graphic display generator 100. The graphic display generator 100, described in more detail below, decodes the received terminal operating instructions and produces a corresponding plurality of color video signals. The color video signals comprise the primary colors red, green and blue.

The color video signals are transformed by the red-green-blue CRT color monitor 200, consisting, for example, of the Conrac 5700, into a multi-colored visual dislay which is presented on the face of the cathode ray tube.

Depending on the control commands and data entered via the keyboard 300, and the requirements of the particular test being conducted by the automatic test station, the visual output appearing on the face of the color monitor 200 may be in alphanumeric and/or graphic format.

The software interface with the automatic test station (not shown) is by means of a compiler such as, for example, the HP-21MX resident high level ATLAS language compiler. The ATLAS language elements include all of the necessary graphics statements for generating multi-colored graphic images on the CRT color monitor in real-time.

A block diagram of the graphic display generator, in accordance with the present invention, is illustrated in FIG. 2. As shown therein, the operation of the graphic display generator is controlled by a microprocessor 101 such as, for example, the Signetics 3000KT8080. The memory 102 utilized in conjunction with microprocessor 101 is chosen to provide adequate storage space for the color graphics display terminal's operating system. As implemented, the terminal's operating system needs 8192 bytes of read only memory (ROM) and 2048 bytes of read/write memory. Conventional techniques may be utilized to implement the individual memory arrays.

The alphanumeric data is conveniently generated by a standard ASCII character 5×7 dot matrix ROM which forms part of the ROM array.

In the edit mode of operation, the keyboard 300 provides the user interface to the color graphics display terminal in the same manner as that provided for most existing CRT terminals.

In the graphic mode of operation, the keyboard 300 is used to enter control commands which are interpreted by the microprocessor 101 to interrupt the control computer or change the mode of operation.

The keyboard interface logic 304 accepts electrical signals from the keyboard 200 and stores the keyboard entry in a pair of eight bit registers. One of the eight bit registers stores alphanumeric data and the other eight bit register stores command keyboard entries such as, for example, character repeat or edit/graphic mode select. The contents of these registers are accessed by the microprocessor 101 using a handshake technique.

When an alphanumeric key on the keyboard 300 is depressed, the keyboard interface logic 304 generates the corresponding 7 bit ASCII code and presents the data on the data bus 120 when requested to do so by the microprocessor 101.

The interface 400 between the color graphics display terminal and the automatic test station control computer (not shown) is defined by the IEEE-488 industry wide standard. Conventional techniques may be utilized to implement the IEEE-488 interface 400. The interface 400 provides the communications path between the automatic test station control computer and the color graphics display terminal's microprocessor 101.

The IEEE-488 bus transfers data to and from the control computer in byte serial fashion. In addition to the 8 bit bi-directional data lines, there are two other sets of lines—a five bit management bus and three lines for handshake. The five management lines and the three handshake lines provide the required functions to handle the information present on the 8 bit bi-directional data lines.

A crystal controlled oscillator is used to provide a time reference source for the color graphics display terminal's clock generator 160. The frequency of the clock generator 160 is selected in accordance with the time needed to generate one picture element (pixel). In the color graphics display terminal, of the present invention, this time is 98.425 nanoseconds.

The buffered output from the clock generator 160 provides the time base for the microprocessor 101, the element/line counter 107, and the four parallel to serial data shift registers 131, 132, 133, 134.

The element/line counter 107 generates the timing for a complete raster scan.

The element counter is a ten bit binary counter which is clocked by the output of the clock generator 160. It generates the time base for one horizontal line. Each count has a duration of one pixel. The time for the total count is equal to the time required for horizontal blanking, retracing and displaying the visible portion of the horizontal line.

The line counter is a nine bit binary counter which is also clocked by the output of the clock generator 160. It generates the time base for the 256 visible lines plus the lines required for vertical retrace.

The video sync generator 108 generates a video sync pulse train and blanking pulse compatible with EIA standard RS 170. Signals from the element counter and line counter are decoded by a field programmable logic array (FPLA) and are utilized to develop the desired output signals from the video sync generator 108.

In the color graphics display terminal of the present invention, three 512×256 point (pixels) dynamic refresh memory arrays are used to generate an eight color graphics picture in much the same manner as conventional raster scan point graphics color systems. However, in the present terminal a fourth refresh memory array has been added. This fourth refresh memory array is identical to the other three refresh memory arrays. It shares all the synchronizing, timing, and video circuits with the three color refresh memory arrays. When the terminal is operating in the edit mode the data that is received from the keyboard 300 or control computer is stored in the fourth refresh memory array for display via one of the color video channels. It is this feature that allows the color graphics display terminal to be used as a standard CRT terminal when operating in the edit mode.

The fourth refresh memory array eliminates dot position, character position, character height, line counters and all of the synchronizing circuitry required to display textual data on a CRT screen in a block mode the way a standard CRT terminal operates.

Figure 3A:
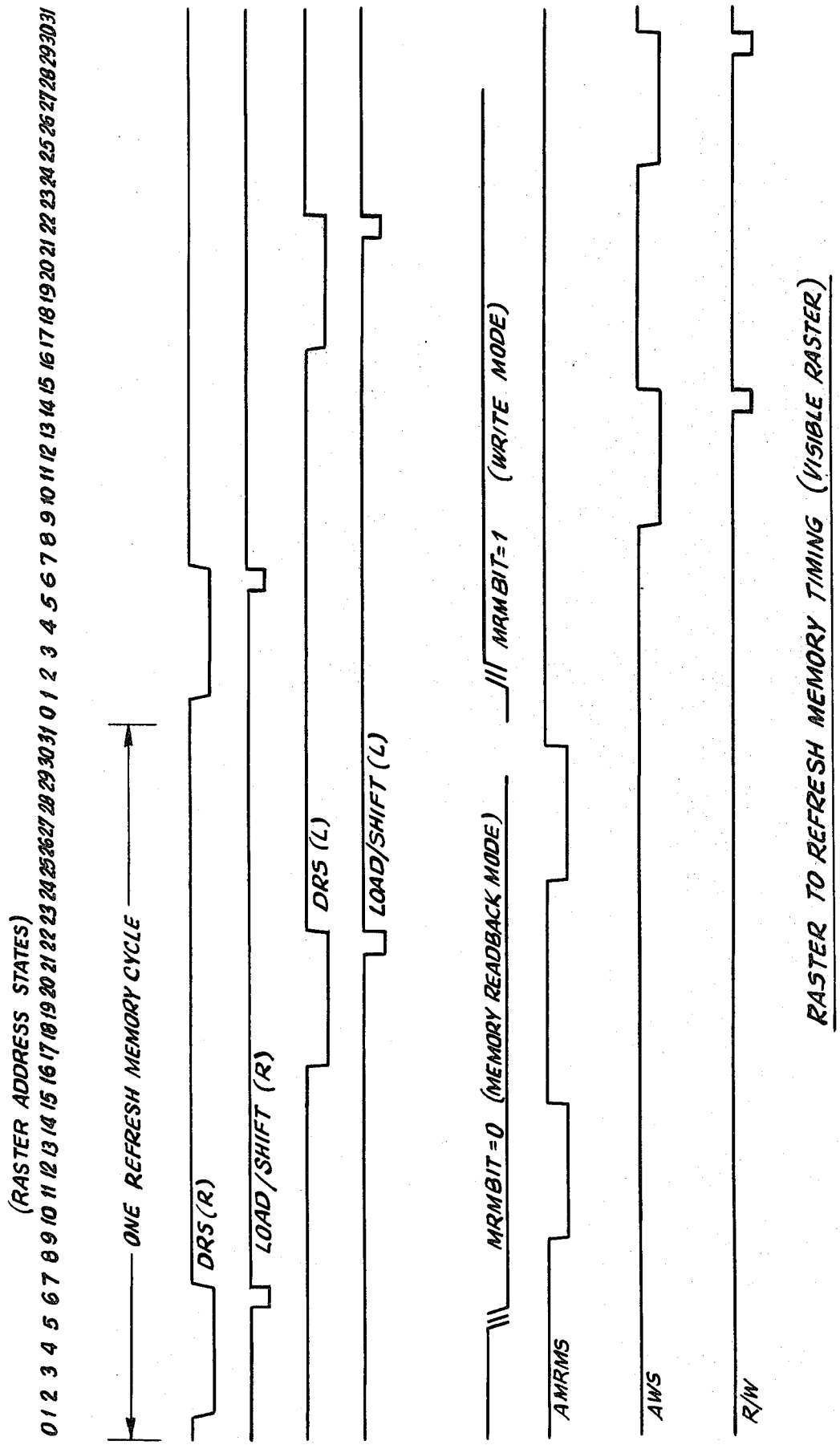
FIG. 3A is a timing diagram for the FPLA decoder raster timing generator during the visible portion of the raster.
Figure 3B:
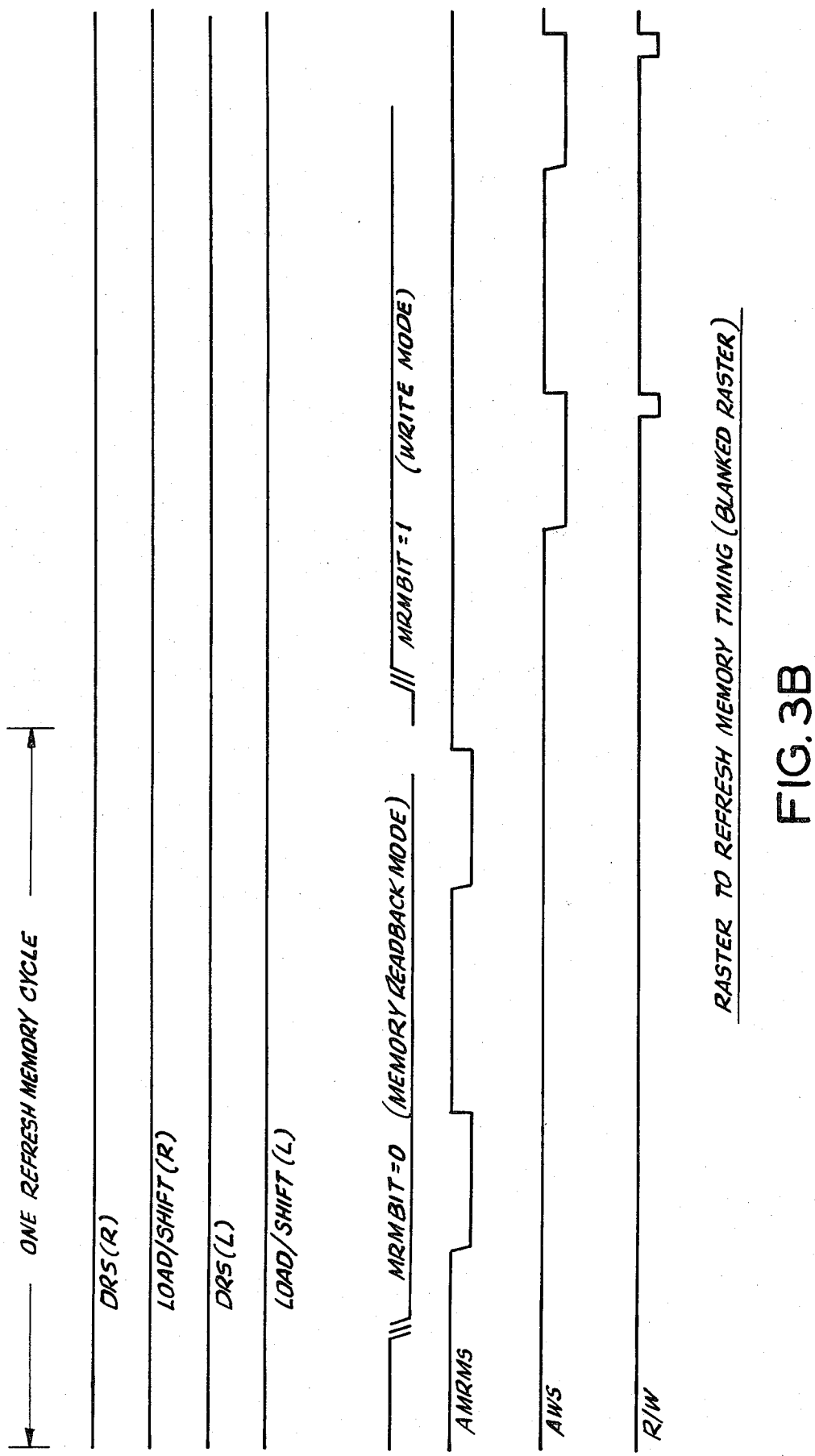
FIG. 3B is a timing diagram for the FPLA decoder raster timing generator during the horizontal and vertical retrace or during the time the raster is blanked.

The FPLA decoder raster timing generator 109 generates the timing signals for the color (red, blue, green) refresh memories 110, 111, 112 and the edit refresh memory 113, and the video. The five least significant bits from the raster element counter and bits 9 and 16 of the raster line counter and the data bit from the mode port 124 are decoded by a FPLA to generate the refresh memory timing signals illustrated in FIGS. 3A and 3B. A tabulation of the FPLA decoder raster timing generator output signals is shown in FIG. 3C. The inputs to the FPLA decoder raster timing generator 109 are raster address bits 0–4 which are decoded by the FPLA to identify any one of 32 states. Raster address bits 9 and 16 are used to identify the blanked raster space, i.e. the time spent during horizontal and vertical retrace. When bits 9 or 16 are high, the timing diagram illustrated in FIG. 3B is applicable and when bits 9 or 16 are low the timing diagram illustrated in FIG. 3A is applicable. The MRMBIT signal from the mode port 124 will put the logic in the memory read-back mode when MRMBIT is a logic 0 and in the write mode when MRMBIT is a logic 1.

Referring to FIG. 3A, the refresh memory is accessed during the two DRS states to update and refresh the display. This occurs two times during each cycle because of interleaving. The load/shift pulses are used to load the 16 bit data word in the appropriate register 131, 132, 133, 134. When the MRMBIT signal is low, a AMRMS is generated during times T9–T14 and T25–T30. This signal is used to read the 16 bit data word from all four memory arrays 110, 111, 112, 113 and to load them in four 16 bit I/O ports, 125, 126, 127, 128. When the MRMBIT signal is high, a AWS is generated during times T9–T14 and T25–T30. This signal is used to select the address from the memory address port 121 and to write the contents of the data port 122 into the selected memory arrays defined by the color port 123. A read/write pulse (R/W) is generated consistent with the timing requirements of the refresh memory arrays.

Referring to FIG. 3B, it is noted that during the blanked raster time intervals the DRS states are eliminated because raster data is not required during horizontal and vertical retrace.

Each of the CRT refresh memories 110, 111, 112, 113 consists of two arrays each containing 4096 16 bit words. The two arrays are interleaved in such a manner that a continuous stream of data in 16 bit parallel form is placed in the respective dual 16 bit shift registers 131, 132, 133, 134 which convert the parallel data to serial format. The reformulated serial data is added to the video sync signals to form a composite video signal, in accordance with EIA standard RS 170, which is used to draw the desired picture.

The memory address port 121 receives the target address for a refresh memory location on the screen of the cathode ray tube. There are 512 elements/line and 256 lines/frame resulting in a total of 512×256 unique addressable points. This data is selected by the timing signal from the raster timing generator 109 during a write state (AWS) or a read memory state (AMRMS).

Address multiplexer 140 selects the raster address from the element/line counter 107 during the refresh memory states to provide the video data for the picture.

The color port 123 accepts data from the data bus 120 to enable the edit refresh memory array 113, or in the graphic mode, any combination of the three color refresh memory arrays 110, 111, 112. This is the only signal required to convert the color graphics display terminal from a point graphic color terminal to an alphanumeric CRT computer terminal.

The data port 122 is used during refresh memory write states (AWS) to accept a one bit message from the microprocessor 101. This data is a logic 1 when the content of the CRT refresh memory loaction (pixel) specified by the contents of the refresh memory address port 121 is selected. The 1 bit message will store a logic 1 in the enabled color refresh memory array 110, 111, 112 in the graphic mode or the edit refresh memory array 113 in the edit mode.

The mode port 124 is used to store a one bit request from the microprocessor 101 in order to select the color refresh memories 110, 111, 112 or the edit refresh memory 113. It is also used to switch the video multiplexer 145. The red, blue, green and edit ports 125, 126, 127, 128, respectively, each consist of two eight bit I/O ports that provide a direct memory readback feature. The microprocessor 101 can read back 16 bits of contiguous data from any of the refresh memories by storing the starting address in the memory address port 121, and then reading the contents of the port corresponding to the selected refresh memory during the memory readback mode states (AMRMS).

The memory readback feature of the present invention allows the contents of any of the graphic refresh memories to be directly transferred to and from the control computer.

On the other hand, all of the existing point graphics systems require that the source program be executed each time the graphics picture is recalled. The reason for this is that the color picture on the CRT is interactive and the parameters on the CRT display will typically be dependent on the test results. Thus, rerunning the test program will not necessarily recall the same display because the test data is a variable.

Shift registers 131, 132, 133 and 134 are dual 16 bit parallel in-serial/parallel out shift registers. The contents of the color refresh memory arrays 110, 111, 112 selected by the mode control port 124 are transferred in parallel. The address is specified by the output of the address multiplexer 140. The timing signals from the raster timing generator 109 are used to select the address from the raster element/line counter 107. The data being shifted serially is therefore synchronized to the raster counter. It is noted the operation is the same for both the edit mode of operation and the graphic mode of operation.

The video multiplexer 145 is enabled by the vertical blanking pulse generated in the video sync generator 108.

In the graphic mode of operation, the video multiplexer 145 selects the video data from the color refresh memories 110, 111, 112 and outputs them directly to the corresponding video driver amplifiers 146, 147, 148, respectively.

In the edit mode of operation, the video multiplexer 145 selects the contents of the corresponding edit shift register 134 and outputs them to the green video driver amplifier 148. During this time the red video driver amplifier 146 and the blue video driver amplifier 147 are blanked.

The three video driver amplifiers 146, 147, 148 are designed using conventional techniques to provide compatibility between the TTL logic levels at the output of the video multiplexer 145 and the EIA RS 170 standard.

It is apparent that the color graphics display terminal of the present invention provides the test engineer with the capability to manipulate schematic diagrams, test patterns, parts layouts, and bar graphs as part of an interactive test program for fault isolation and detection. Color may be used to illustrate, for example, the exact portion of the circuit that is being tested or is in need of calibration or is malfunctioning. Color may also be used to color a bar graph that, as part of an interactive display, changes levels as the test engineer/operator varies adjustable parameters, etc.

As noted above, one of the basic differences between the color graphics display terminal and existing graphics display terminals is the dual-mode capability provided by the terminal of the present invention.

The advantages of this dual-mode capability are best explained in connection with FIG. 1. Referring again to FIG. 1, it is noted that in the edit mode of operation, the color graphics display terminal emulates a monochrome alphanumeric terminal, i.e. it accepts "write" and "read" requests from the automatic test station control computer (not shown).

The "write" request are used to display textual (alphanumeric) data on the color monitor 300, as received from the control computer. The textual data are displayed in a single color such as, for example, green.

The "read" requests are used to transmit to the control computer textual data entered via the keyboard 300. The entered data (characters) are echoed on the color monitor 200 and can be edited (modified) by the ATE operator before transmittal to the control computer.

The edit mode of operation provides the capability of entering, updating (modifying) unit-under-test programs without effecting the graphic image produced previously, and causing their execution.

In the graphic mode of operation, the color graphics display terminal provides the capability of displaying multi-colored graphic and alphanumeric data on the color monitor 200. In this mode of operation the color graphics display terminal accepts terminal operating instructions in the form of character strings from the control computer defining the picture to be displayed on the color monitor 200. The terminal operating instructions convey information such as, for example, the following: color selection; control mode selection (rectangle, vector, textual data, conic, triangle, diamond, primitive data); positional addressing; and display format (solid/hollow, replacement/additive write, horizontal/vertical direction, line thickness, etc.).

When the color graphics display terminal is operated in the graphic mode, the keyboard 300 is disabled, except for generating a control computer interrupt to signal the operator's intention to terminate current operation and edit/graphic mode select commands. Thus, in the graphic/mode of operation the color graphics display terminal functions as an output device, i.e. the keyboard 300 cannot be used to enter textual data. The information displayed in the graphic mode typically includes information of the following type: functional block diagrams; diagnostic flowcharts; test diagrams; replacement parts data; parts layout drawings; and logic and schematic diagrams.

As noted previously, the color images to be displayed are programmed in the high level ATLAS language using conventional programming techniques.

The information to be displayed on the color monitor 200 in both the graphic and edit modes is stored within the graphic display generator 100. Separate CRT refresh memories are provided for each of these modes. Thus, selecting edit mode does not destroy the last picture generated in the graphic mode, and vice versa. Mode selection is accomplished as follows. At any time the ATE operator can select the edit or graphic mode by depressing the appropriate mode select button on the keyboard 300. When edit mode is selected, the textual information stored in the edit refresh memory is displayed on the color monitor 200. When graphic mode is selected, the information stored in the three graphic refresh memories (red, green and blue) is displayed. Mode selection can also be accomplished by the control computer by issuing the appropriate edit or graphic mode select command.

It is apparent that the dual-mode feature provides the important capability of being able to modify a program without destroying the last image produced by the particular program during its execution. Using conventional graphics display terminals the last graphic image produced would be destroyed upon initiating the program editing process. It is clear that this undesirable graphic image destruction would unduly complicate program generation and editing, since it is very difficult to edit a program when one no longer can see the errors which must be corrected.

Additional features of the color graphics display terminal of the present invention include true random vector display capability, selectable erase capability, and the capability to accommodate transverse and raster data modes thus providing for simple software generation of special symbols and characters.

It is apparent that a judiciously composed multi-colored graphic image can significantly enhance the man-machine interface, particularly when manual troubleshooting is required for unambiguous fault isolation. Typical troubleshooting displays include: test program functional flowcharts; test program diagnostic flowcharts; test diagrams; and unit-under-test outlines, identifying the location of good and faulty components.

A further feature of the color graphics display terminal, in accordance with the present invention, includes the capability to display information in the following colors: red, green, blue, cyan, magenta, yellow, white and black. In utilizing the color graphics display terminal to display a test program functional flowchart this versatility allows the operator to select the following colors, for example, to denote the status of the test: green, test passed; red, test failed; yellow, test in progress; and white, test not yet conducted.

With the implementation of the color graphics display terminal, in accordance with the present invention, the presentation of analog test data is no longer limited to the display of numerical values such as, for example, measured value and/or upper/lower limits. The "meter-bar" display format is very useful when interactive adjustments must be performed on the unit-under-test.

Although the invention has been described as applied to computerized automatic test equipment it can be applied to other systems such as, for example, an industrial process control and monitoring system. Since the color graphics display terminal derives its intelligence from a resident microprocessor, the program stored in the microprocessor's memory can readily be changed to accommodate other types of applications.

Accordingly, it is clear that the above description of the preferred embodiment in no way limits the scope of the present invention which is defined by the following claims.

What is claimed is:

1. A color graphics display terminal having an edit mode of operation and a graphic mode of operation and adapted for real-time data communication with a control computer comprising:
   (a) means for entering control commands and data into said terminal;
   (b) means for transmitting the control commands and data from said terminal to said control computer for formulating operating instructions, said operating instructions including terminal operating instructions;
   (c) means for receiving the terminal operating instructions from said control computer;
   (d) means for decoding the terminal operating instructions, said decoding means including means for producing a plurality of color video signals; and
   (e) means for transforming the plurality of color video signals into a multi-colored visual display.

2. A color graphics display terminal having an edit mode of operation and a graphic mode of operation and adapted for real-time data communication with a control computer comprising:
   (a) keyboard means for entering control commands and data into said terminal;
   (b) bi-directional communication means for transmitting the control commands and data from said terminal to said control computer for formulating operating instructions, said operating instructions including terminal operating instructions, and for receiving the terminal operating instructions from said control computer;
   (c) display generating means for decoding the terminal operating instructions, said display generating means including means for producing a plurality of color video signals; and
   (d) display means for transforming the plurality of color video signals into a multi-colored visual display.

3. A color graphics display terminal as recited in claim 2 wherein said display generating means includes a plurality of cathode ray tube refresh memories for storing the data content of said plurality of color video signals.

4. A color graphics display terminal as recited in claim 3 wherein said display generating means further includes first means for operating said terminal in the edit mode and second means for operating said terminal in the graphic mode.

5. A color graphics display terminal as recited in claim 4 wherein said keyboard means includes means for activating one of said first operating means and second operating means.

6. A color graphics display terminal as retired in claim 5 wherein said display generating means includes means for transferring the stored contents of said plurality of cathode ray tube refresh memories to said control computer when said terminal is operating in the graphic mode.

7. A color graphics display terminal as recited in claim 6 wherein the plurality of color video signals includes a red video signal, a green video signal, and a blue video signal.

8. A color graphics display terminal as recited in claim 7 wherein the plurlity of cathode ray tube refresh memories includes an edit refresh memory, a red graphic refresh memory, a green graphic refresh memory, and a blue graphic refresh memory.

9. A color graphics display terminal as recited in claim 8 wherein said display generating means includes a microprocessor which communicates with said control computer via said bi-directional communication means.

10. A color graphics display terminal as recited in claim 9 wherein said bi-directional communication means includes an IEEE-488 compatible bus.

11. A color graphics display terminal as recited in claim 10 werein said display means includes a color cathode ray tube adapted to accommodate raster scanning techniques.

12. A color graphics display terminal having an edit mode of operation and a graphic mode of operation and adapted for real-time data communication with an automatic test station control computer comprising:
   (a) means for entering control commands and data into said terminal;
   (b) means for transmitting the control commands and data from said terminal to said automatic test station control computer for formulating operating instructions, said operating instructions including terminal operating instructions;
   (c) means for receiving the terminal operating instructions from said automatic test station control computer;
   (d) means for decoding the terminal operating instructions, said decoding means including means for producing a plurality of color video signals; and (e) means for transforming the plurality of color video signals into a multi-colored visual display.

13. A color graphics display terminal having an edit mode of operation and a graphic mode of operation and adapted for real-time data communication with an automatic test station control computer comprising:
   (a) keyboard means for entering control commands and data into said terminal;
   (b) bi-directional communication means for transmitting the control commands and data from said terminal to said automatic test station control computer for formulating operation instructions, said operating instructions including terminal operating instructions, and for receiving the terminal operating instructions from said automatic test station control computer;
   (c) display generating means for decoding the terminal operating instructions, said display generating means including means for producing a plurality of color video signals; and
   (d) display means for transforming the plurality of color video signals into a multi-colored visual display.

14. A color graphics display terminal as recited in claim 13 wherein said display generating means includes a plurality of cathode ray tube refresh memories for storing the data content of said plurality of color video signals.

15. A color graphics display terminal as recited in claim 14 wherein said display generating means further includes first means for operating said terminal in the edit mode and second means for operating said terminal in the graphic mode.

16. A color graphics display terminal as recited in claim 15 wherein said keyboard means includes means for activating one of said first operating means and second operating means.

17. A color graphics display terminal as recited in claim 16 wherein said display generating means includes means for transferring the stored contents of said plurality of cathode ray tube refresh memories to said automatic test station control computer when said terminal is operating in the graphic mode.

18. A color graphics display terminal as recited in claim 17 wherein the plurality of color video signals includes a red video signal, a green video signal, and a blue video signal.

19. A color graphics display terminal as recited in claim 18 wherein the plurality of cathode ray tube refresh memories includes an edit refresh memory, a red graphic refresh memory, a green graphic refresh memory, and a blue graphic refresh memory.

20. A color graphics display terminal as recited in claim 19 wherein said display generating means includes a microprocessor which communicates with said automatic test station control computer via said bi-directional communication means.

21. A color graphics display terminal as recited in claim 20 wherein said bi-directional communication means includes an IEEE-488 compatible bus.

22. A color graphics display terminal as recited in claim 21 wherein said display means includes a color cathode ray tube adapted to accommodate raster scanning techniques.

23. A color graphics display terminal having an edit mode of operation and a graphic mode of operation and adapted for real-time data communication with an automatic test station control computer comprising:
   (a) keyboard means for entering control commands and data into said terminal, said keyboard means including means for selecting one of said edit mode of operation and graphic mode of operation;
   (b) bi-directional communication means for transmitting the control commands and data from said terminal to said automatic test station control computer for formulating operating instructions, said operating instructions including terminal operating instructions, and for receiving the terminal operating instructions from said automatic test station control computer, said bi-directional communication means including an IEEE-488 compatible bus;
   (c) display generating means for decoding the terminal operating instructions, said display generating means including a microprocessor which communicates with said automatic test station control computer via said bi-directional communication means, said display generating means including means for producing a plurality of color video signals, said plurality of color video signals including a red video signal, a green video signal, and a blue video signal, said display generating means also including a plurality of cathode ray tube refresh memories for storing the data content of said plurality of color video signals, said plurality of cathode ray tube refresh memories including an edit refresh memory, a red graphic refresh memory, a green graphic refresh memory, and a blue graphic refresh memory, said display generating means further including means responsive to said keyboard means for operating said terminal in one of said edit mode of operation and graphic mode of operation and means for transferring the stored contents of said plurality of cathode ray tube refresh memories to said automatic test station control computer when said terminal is operating in the graphic mode; and
   (d) display means for transforming the plurality of color video signals into a multi-colored visual display, said display means including a color cathode ray tube adapted to accommodate raster scanning techniques.

* * * * *